(12) United States Patent
Hoppe

(10) Patent No.: US 9,105,781 B2
(45) Date of Patent: Aug. 11, 2015

(54) THERMOCOUPLE AND METHOD OF PRODUCTION

(71) Applicant: O-FLEXX TECHNOLOGIES GMBH, Duisburg (DE)

(72) Inventor: Stefan Hoppe, Dorsten (DE)

(73) Assignee: O-FLEXX TECHNOLOGIES GMBH, Duisburg (DE)

(*) Notice: Subject to any disclaimer, the term of this patent is extended or adjusted under 35 U.S.C. 154(b) by 0 days.

(21) Appl. No.: 14/352,225

(22) PCT Filed: Oct. 22, 2012

(86) PCT No.: PCT/EP2012/070876
§ 371 (c)(1),
(2) Date: Apr. 16, 2014

(87) PCT Pub. No.: WO2013/060648
PCT Pub. Date: May 2, 2013

(65) Prior Publication Data
US 2014/0246067 A1 Sep. 4, 2014

(30) Foreign Application Priority Data
Oct. 24, 2011 (DE) .......................... 10 2011 054 739

(51) Int. Cl.
*H01L 35/34* (2006.01)
*H01L 35/08* (2006.01)
*H01L 35/04* (2006.01)
*H01L 35/32* (2006.01)
*H01L 23/38* (2006.01)

(52) U.S. Cl.
CPC ................ *H01L 35/04* (2013.01); *H01L 23/38* (2013.01); *H01L 35/08* (2013.01); *H01L 35/32* (2013.01); *H01L 35/34* (2013.01); *H01L 2924/0002* (2013.01)

(58) Field of Classification Search
CPC .......... H01L 35/08; H01L 35/32; H01L 35/34
USPC ...................... 136/201, 205, 225, 242; 438/55
See application file for complete search history.

(56) References Cited

U.S. PATENT DOCUMENTS 3,943,553 A 3/1976 Elfving
4,343,960 A * 8/1982 Eguchi et al. ................. 136/225

(Continued)

FOREIGN PATENT DOCUMENTS

DE 101 22 679 A1 12/2002
DE 10 2004 030 043 A1 1/2006

(Continued)

*Primary Examiner* — Golam Mowla
(74) *Attorney, Agent, or Firm* — Lucas & Mercanti, LLP

(57) ABSTRACT

A method for the low-cost production of sheet-like thermocouples comprises the following steps: —providing an electrically and thermally conductive substrate having at least one clearance, which subdivides the substrate into substrate regions, —fitting thermolegs onto the substrate, wherein each thermoleg is connected to a region of the substrate on a hot side and on a cold side, —applying an encapsulation, so that at least each thermoleg is enclosed and the encapsulation enters into a material bond with the regions of the substrate, —separating parts of the substrate in such a way as to prevent a flow of electric current between the regions of the substrate through the at least one clearance. The invention also relates to a substrate that is suitable for carrying out the method and to a thermocouple that can be produced by the method.

12 Claims, 8 Drawing Sheets

(56) References Cited

U.S. PATENT DOCUMENTS

| | | | |
|---|---|---|---|
| 4,482,915 A * | 11/1984 | Nishikawa et al. | 257/669 |
| 4,859,250 A | 8/1989 | Buist | |
| 4,938,244 A * | 7/1990 | Kumada et al. | 136/212 |
| 5,022,928 A * | 6/1991 | Buist | 136/212 |
| 5,122,858 A | 6/1992 | Mahulikar | |
| 5,254,178 A * | 10/1993 | Yamada et al. | 136/204 |
| 5,449,910 A * | 9/1995 | Wood et al. | 250/338.1 |
| 6,121,539 A * | 9/2000 | Johnson et al. | 136/203 |
| 2002/0056903 A1 | 5/2002 | Li | |
| 2006/0162761 A1* | 7/2006 | Tanielian | 136/205 |

FOREIGN PATENT DOCUMENTS

| | | |
|---|---|---|
| EP | 1102333 A2 | 5/2001 |
| EP | 1976034 A2 | 10/2008 |
| GB | 911828 A | 11/1962 |

* cited by examiner

THERMOCOUPLE AND METHOD OF PRODUCTION

CROSS-REFERENCE TO RELATED APPLICATIONS

This application is a 371 of PCT/EP2012/070876 filed Oct. 22, 2012, which in turn claims the priority of DE 10 2011 054739.8 filed Oct. 24, 2011, the priority of both applications is hereby claimed and both applications are incorporated by reference herein.

BACKGROUND OF THE INVENTION

The invention relates to a method for producing a thermocouple having at least two thermolegs, one formed of p-doped semiconductor material and one formed of n-doped semiconductor material, which are electrically conductively interconnected alternately on a hot and a cold side, a thermocouple that can be produced in accordance with the method, and a substrate provided for the method.

The operating principle of thermocouples is based on the thermoelectric effect. In the case of the Seebeck effect, an electric voltage is created between two points of an electric conductor or semiconductor that have a different temperature. Whereas the Seebeck effect describes the creation of a voltage, the Peltier effect occurs exclusively by the flowing of an external current. The Peltier effect occurs when two conductors or semiconductors having different electronic thermal capacities are brought into contact and electrons flow from one conductor/semiconductor into the other due to an externally applied electric current. Both thermoelectric effects occur in a thermocouple through which current is flowed.

Thermocouples preferably consist of differently doped semiconductor materials, whereby the efficiency can be considerably increased with respect to thermocouples having two different metals interconnected at one end. Conventional semiconductor materials are $Bi_2Te_3$, $PbTe$, $SiGe$, $BiSb$ or $FeSi_2$.

A conventional thermocouple consists of two or more small cuboids formed from p- and n-doped semiconductor material, which are interconnected alternately above and below by metal bridges. The metal bridges simultaneously form the thermal contact areas on a hot and cold side of the thermocouple and are usually arranged between two ceramic plates arranged at a distance from one another. A thermocouple is formed in each case by an n-doped and a p-doped cuboid, wherein the cuboids extend between the hot and the cold side of the thermoelectric element. The differently doped cuboids are interconnected by the metal bridges such that they produce a series connection.

If an electric current is fed to the cuboids, the connection points of the cuboids on the cold side cool according to the current intensity and current direction, whereas the connection points on the opposite hot side heat up. The applied current thus produces a temperature difference between the ceramic plates. If, however, a different temperature is applied to the opposite ceramic plates, a current flow is produced in the cuboids of the thermocouple according to the temperature difference.

The edge lengths of the cuboids in all directions are approximately 1-3 mm. The form of the cuboid is roughly approximated with a cube. The considerable thickness of the cuboids is necessary, since these serve not only to achieve the thermoelectric effect, but additionally ensure the mechanical stability of the thermoelectric element. The cuboids require a large amount of semiconductor material, which is not necessary in order to achieve the thermoelectric effect.

GB 911 828 A discloses a thermocouple, in which metal plates are soldered to the cuboids of said thermocouple both on the cold and the hot side. The metal plates arranged offset in relation to one another on the hot and cold side are each deflected by 90° along a line. The deflected regions of the metal plates on the hot and cold side are arranged parallel to one another in a mutually spaced manner. The cuboids are soldered between the deflected regions of opposite metal plates. The cuboids and parts of the plates are then cast in an electrically insulating compound that is a poor thermal conductor. The stability of the thermocouple is to be improved by the casting process. A disadvantage of the known thermocouple lies in the fact that the cuboids have to be relatively large for the placement and soldering between the deflected regions. The placement and soldering between the deflected regions also contradicts cost-effective production of the thermocouples on a mass scale.

Besides the conventional thermocouples, what are known as thin-film thermocouples are known. For example, DE 101 22 679 A1 discloses a thin-filmed thermocouple which comprises a flexible substrate material made of plastic, to which thin-film thermocouples are applied. Strip-like thermolegs arranged side by side and made of a first material and made of a second material are formed, wherein the thermolegs are electrically conductively interconnected at their ends in pairs via a coupling structure, in particular made of the second material. The thermolegs and coupling structure are applied by means of conventional deposition methods. Due to the thermolegs coupled alternately on the hot and on the cold side, a series connection of a plurality of thermocouples over a small area of approximately 8×15 mm is formed. The thickness of the thermolegs of a thin-film thermocouple lies in a range of 1-10 μm.

The thin-film technology has the disadvantage that the electrical resistance of the thermoleg is very large due to the low layer thickness, which has a disadvantageous effect on the efficiency. In order to stabilize the unstable thermolegs, these have to be applied over their entire area to the plastic substrate. The low thermal conductivity of the plastic substrate indeed in principle has a positive effect on the efficiency of the thin-film thermocouple, however it is difficult to couple and decouple heat into/from the coupling structures of the thermocouple on the hot and cold side, which are applied to the substrate made of plastic. Ultimately, the application of the thermolegs to the plastic substrate and therefore the production of the thermocouple are complex. EP 1 976 034 A discloses a further thin-film thermocouple, of which the thermolegs are arranged on a substrate having partly insulating properties and extending between two frame parts on the hot and cold side of the thermocouple.

BRIEF SUMMARY OF THE INVENTION

An object of the invention is to propose a method for the cost-effective production of thermocouples, in particular flat thermocouples, having a stability comparable to that of conventional thermocouples with simultaneously reduced use of thermoelectric material.

Furthermore, a substrate suitable for carrying out the method and a flat thermocouple that can be produced in accordance with the method and that has high stability are to be specified.

This object is achieved with a method of the type mentioned at the outset in that said method comprises the following steps:

providing a substrate, which consists exclusively of an electrically and thermally conductive material and has at least one aperture, which divides the substrate into substrate regions on the hot side and substrate regions on the cold side of the thermocouple, fitting the substrate with thermolegs, wherein each thermoleg is placed on a substrate region on the hot side and on a substrate region on the cold side and is electrically and thermally conductively connected to the substrate region on the hot side and to the substrate region on the cold side, applying an encapsulation, such that at least each thermoleg is encased and the encapsulation bonds integrally to the substrate region on the hot side and to the substrate region on the cold side of each thermoleg, separating parts of the substrate in such a way that a flow of electric current between the substrate regions is prevented by the at least one aperture.

On the provided substrate, which is preferably planar, the aperture determines the position relative to one another of the substrate regions on the hot and cold side. Once the substrate has been fitted with thermolegs and preferably after the encapsulation process, substrate parts provided merely for stabilization are separated, in particular, the substrate parts surrounding the substrate regions in a frame-like manner. Once the stabilizing substrate parts electrically conductively connecting the substrate regions have been removed, a direct flow of electric current between all substrate regions on the hot and cold side is prevented by the at least one aperture. The thermolegs, which were previously connected to a substrate region on the hot side and to a substrate region on the cold side in a manner bridging the aperture now take over the role of fixing the position of the substrate regions relative to one another, as does the encapsulation preferably applied before the separation of the substrate parts. The desired flow of current between the substrate regions via the thermolegs bridging the aperture is possible without restriction however and is not impaired by the separation of the substrate parts. At the same time, the substrate regions on the hot and cold side are thermally decoupled by the separation of the substrate parts.

In accordance with the invention the substrate is fitted with thermolegs having a thickness in the range of 20 µm-500 µm. This thickness range is above the thickness range of the thin-film technology described in the introduction, but is considerably below the shortest edge length of the cuboids of conventional thermoelectric elements. In this intermediate size range utilized in accordance with the invention, the thermocouple can be structured in one plane, comparatively to thin-film technology. It is possible to conduct electric current and heat via the planar, electrically and thermally conductive substrate regions into the regions of the flat thermolegs resting thereon. Due to the now significantly larger cross sections of the thermolegs compared with the thermolegs formed using thin-film technology, an encapsulation can be applied for stabilization without significantly impairing the thermal efficiency. It is no longer necessary to support the thermolegs over their entire area by a plastic substrate that is electrically conductive but a poor thermal conductor: rather, the thermolegs can be applied directly to the electrically and thermally conductive substrate regions distanced by the aperture. In the case of the known thin-film technology, the thermal resistance with the use of the heat flow in the direction of the thermoleg formed as a layer is so large however due to the low layer thickness that any type of technically expedient encapsulation would cause a thermal short circuit.

If the substrate fitted with thermolegs is bent around a bending line in unencapsulated substrate regions once parts of the substrate have been separated, contact portions may be deflected at an angle of approximately 90° in order to enable a stable connection of the substrate regions on the hot side to a heat source and of the substrate regions on the cold side to a heat sink.

In order to produce thermocouples with the known meandering structure formed of thermolegs and coupling structures by means of the method according to the invention, a substrate consists of an electrically and thermally conductive material; the substrate is cuboidal; the substrate has two opposing flat surfaces delimited laterally by end sides and on a hot side and a cold side by longitudinal sides; the substrate has at least one aperture through the flat surfaces, the at least one aperture dividing the substrate into substrate regions on the hot side and substrate regions on the cold side; and the aperture having a first portion parallel to the longitudinal sides, the aperture has at least one second portion extending from the first portion in the direction toward the longitudinal side on the cold side, the aperture having at least one third portion extending from the first portion in the direction toward the longitudinal side on the hot side, and the second and third portions being offset in relation to one another in the longitudinal direction.

A thermocouple that can be produced in particular with the aid of the method according to the invention has at least two thermolegs, at least one first thermoleg of the at least two thermolegs formed of p-doped semiconductor material and at least one second thermoleg of the at least two thermolegs formed of n-doped semiconductor material are electrically alternatingly conductively interconnected on a hot side and a cold side, wherein a temperature gradient between the hot and the cold side of the thermocouple can be applied or tapped; a plurality of supporting parts on the hot side of the thermocouple and a plurality of supporting parts on the cold side of the thermocouple, each of the supporting parts consisting of an electrically and thermally conductive material and having a planar surface to be fitted with thermolegs, the planar surfaces of the supporting parts lie in one plane, the supporting parts are arranged at a distance from one another in such a way that they do not contact one another, and each of the at least two thermolegs is electrically and thermally conductively connected to a respective planar surface of a respective one of the supporting parts on the hot side and to the planar surface of a respective one of the supporting parts on the cold side; and at least one encapsulation encasing each thermoleg and bonded to the supporting part on the hot side and to the supporting part on the cold side of each of the at least two thermolegs.

Since the supporting parts of the thermocouple consist exclusively of a material that is a good electrical and thermal conductor, there is no need to provide separate coupling structures in order to electrically conductively interconnect the thermolegs on the hot and cold side. Furthermore, the material of the supporting parts is a good thermal conductor, and improves the coupling and decoupling of heat into/from the coupling structures, which are formed by the supporting parts themselves. In particular, metals that additionally have a high thermal conductivity and thus further improve the coupling and decoupling of the heat into/from the coupling structures of the thermocouple are used in particular as electrically and thermally conductive material for the supporting parts.

The planar surfaces, to be fitted with thermolegs, of all supporting parts lying in a plane can be fitted with the flat thermolegs particularly easily in automated production methods. An edge region of each thermoleg is placed on a supporting part on the hot side, and the other end is placed on a supporting part on the cold side.

The supporting parts are arranged at a distance from one another in such a way that they do not contact one another. A short circuit between the electrically conductive supporting parts also serving as coupling structures is thus prevented. In addition, the distance between the supporting parts causes the supporting parts on the hot side to be thermally decoupled from the supporting parts on the cold side. The distance can be formed for example as an air gap with a width of approximately 0.1 mm.

In order to further mechanically stabilize the composite formed of the supporting parts and the relatively thin thermolegs, of which the thickness preferably lies in a range of 20 µm-500 µm, the thermocouple comprises at least one encapsulation, which is integrally bonded to the supporting part on the hot side and to the supporting part on the cold side of each thermoleg and encases each thermoleg. The encapsulation causes the components to be fixed to one another and additionally increases the vibration and impact resistance of the thermocouple, which is of importance in particular when attaching the thermocouple to (moved) machines. The encapsulation additionally constitutes protection against contact, moisture and soiling for the sensitive thermolegs. The encapsulation is formed in particular as a potting compound. The encapsulation consists of a material that is not electrically conductive and is also a relatively poor thermal conductor, such as foamed ceramic, glass or thermosets. Due to the thickness of the thermolegs in the specified preferred range, the encapsulation hardly impairs the efficiency of the thermocouple with suitable material selection.

If the supporting parts consist of a plastically or elastically deformable material, the thermocouple can be used in a large number of possible applications. Furthermore, the deformable material allows the bending of the supporting parts in unencapsulated regions.

An improved coupling and decoupling of heat into/from the supporting parts serving as coupling structures is achieved if a contact portion of each supporting part is not encased by the encapsulation. The heat can be coupled in and decoupled via this contact portion in a manner unhindered by the encapsulation.

In order to ensure a stable attachment to a heat source on the hot side and to a heat sink on the cold side, the contact portions can be deflected from the plane of the surface fitted with thermolegs.

The bent contact portions can be fastened to two plates of a module arranged at a distance from one another and parallel to one another, wherein the contact portions of the supporting parts on the hot side are connected to one of the two plates and the contact portions of the supporting parts on the cold side are connected to the other of the two plates. The thermocouple arranged in such a way between the plates of the module can be bent once or more by approximately 180 degrees about a bending line running perpendicularly to the plates (folded thermocouple).

BRIEF DESCRIPTION OF THE DRAWINGS

The thermocouple according to the invention and production thereof will be explained in greater detail hereinafter on the basis of the FIGS. 1-8, in which.

DETAILED DESCRIPTION OF THE INVENTION

Figure 1:
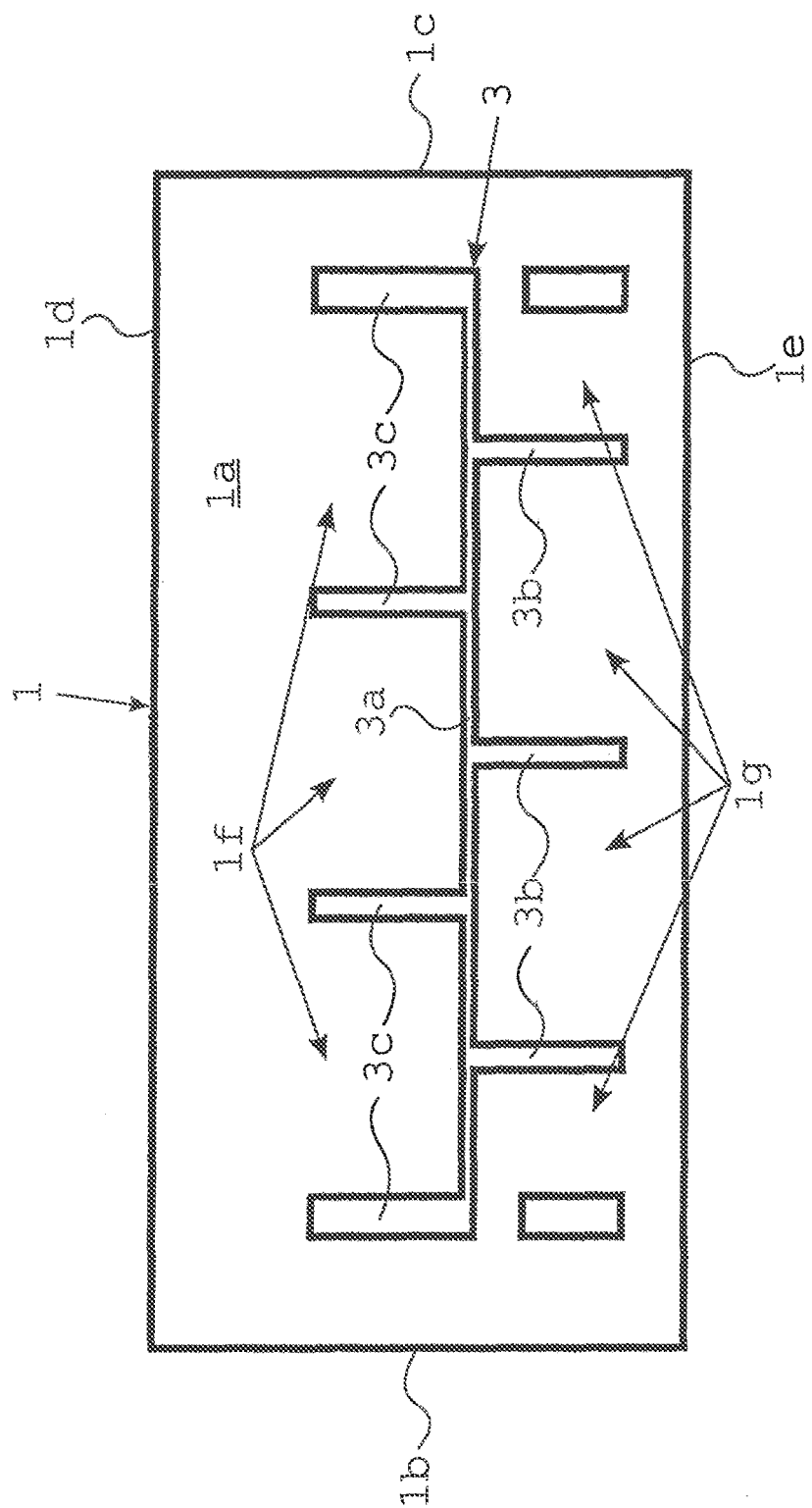
FIG. 1 shows the provision of a substrate for producing a thermocouple.

FIG. 1 shows the provision of a plate-like substrate (1) made of an electrically conductive material, in particular in the form of a thin sheet metal. The surfaces (1a) of the flat and cuboidal substrate (1) are delimited laterally by end sides (1b, 1c), by a longitudinal side (1d) on the hot side and by a longitudinal side (1e) on the cold side.

An aperture (3) is arranged in the substrate (1) and divides the substrate (1) into electrically conductive substrate regions (1f) on the hot side of the substrate and electrically conductive substrate regions (1g) on the cold side of the substrate. The aperture (3) comprises a first portion (3a), which runs parallel to the longitudinal sides (1d, 1e) of the substrate (1). Three second portions (3b) extend from the first portion (3a) in the direction of the longitudinal side (1e) on the cold side of the substrate. In addition, four third portions (3c) extend from the first portion (3a) in the direction of the longitudinal side (1d) on the hot side of the substrate, wherein the second and third portions (3b, 3c) are offset in relation to one another. The substrate (1) further comprises the aperture (3) and the substrate parts surrounding substrate regions (1f, 1g) and forming a stabilizing edge which runs along the longitudinal sides (1d, 1e) and the end sides (1b, 1c) of the substrate (1).

The aperture (3) is formed in the illustrated exemplary embodiment as an opening in the substrate between the various substrate regions (1f, 1g). The substrate (1) is formed in the illustrated exemplary embodiment as a metal sheet. The substrate may also be a substrate made of a flexible, electrically conductive material however, which for example can be rolled as a sheet onto a reel.

Figure 2:
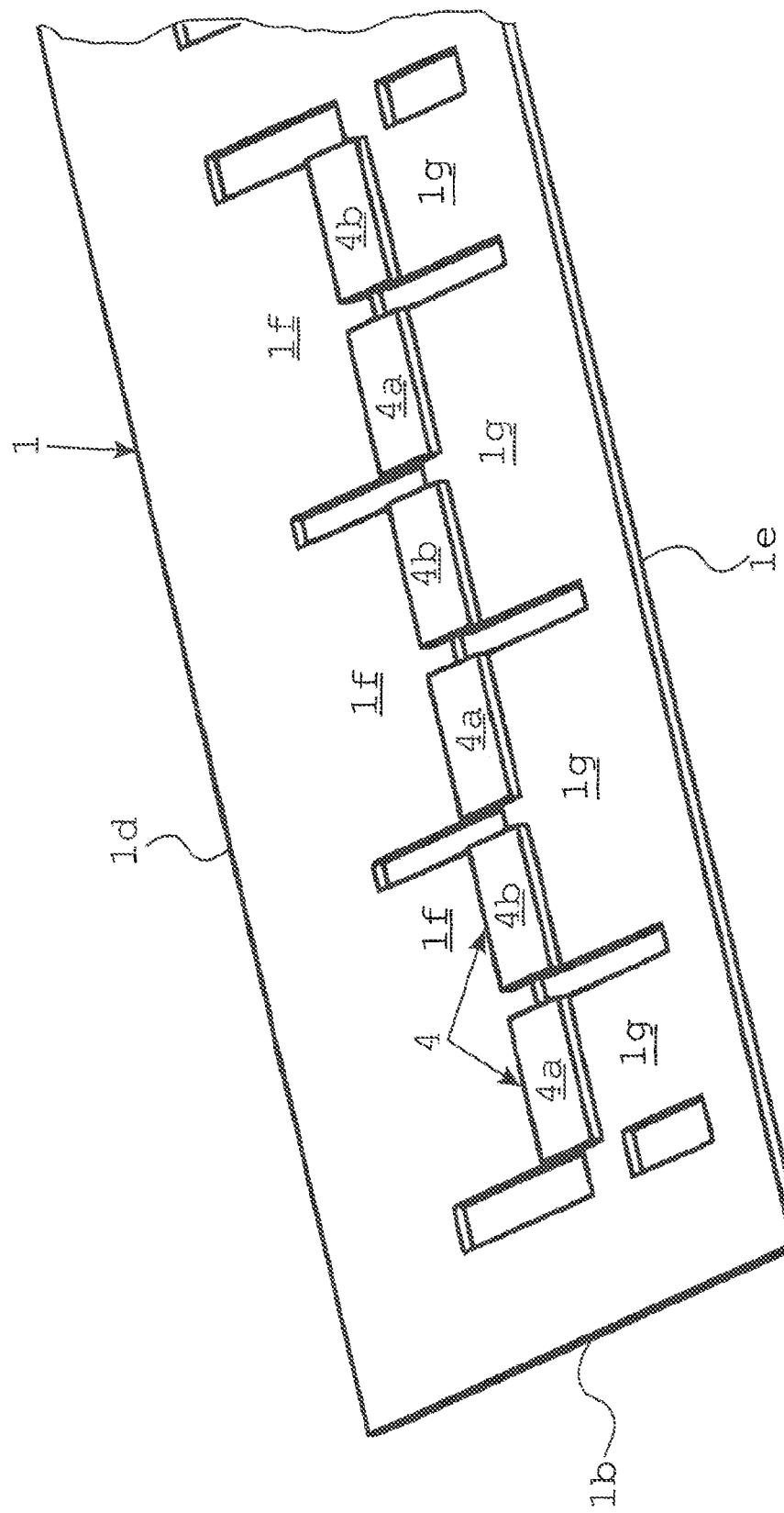
FIG. 2 shows the fitting of a substrate according to FIG. 1 with thermolegs.

FIG. 2 shows how the substrate (1) according to FIG. 1 is fitted with thermolegs (4). The thermolegs (4) made of p-doped semiconductor material (4a) and n-doped semiconductor (4b) are electrically conductively interconnected alternately on the hot side (1d) and on the cold side (1e) by means of the substrate regions serving as coupling elements (1f, 1g). To this end, each thermoleg (4) is electrically conductively connected to an electrically conductive substrate region (1f) on the hot side and to an electrically conductive substrate region (1g) on the cold side, whereby the known meandering structure of the thermolegs (4a, 4b) is formed from p- and n-doped semiconductor material on the substrate (1). The electrically conductive connection is produced with the aid of soldering or sintering pastes or alternatively by electrically conductive adhesives.

Figure 3:
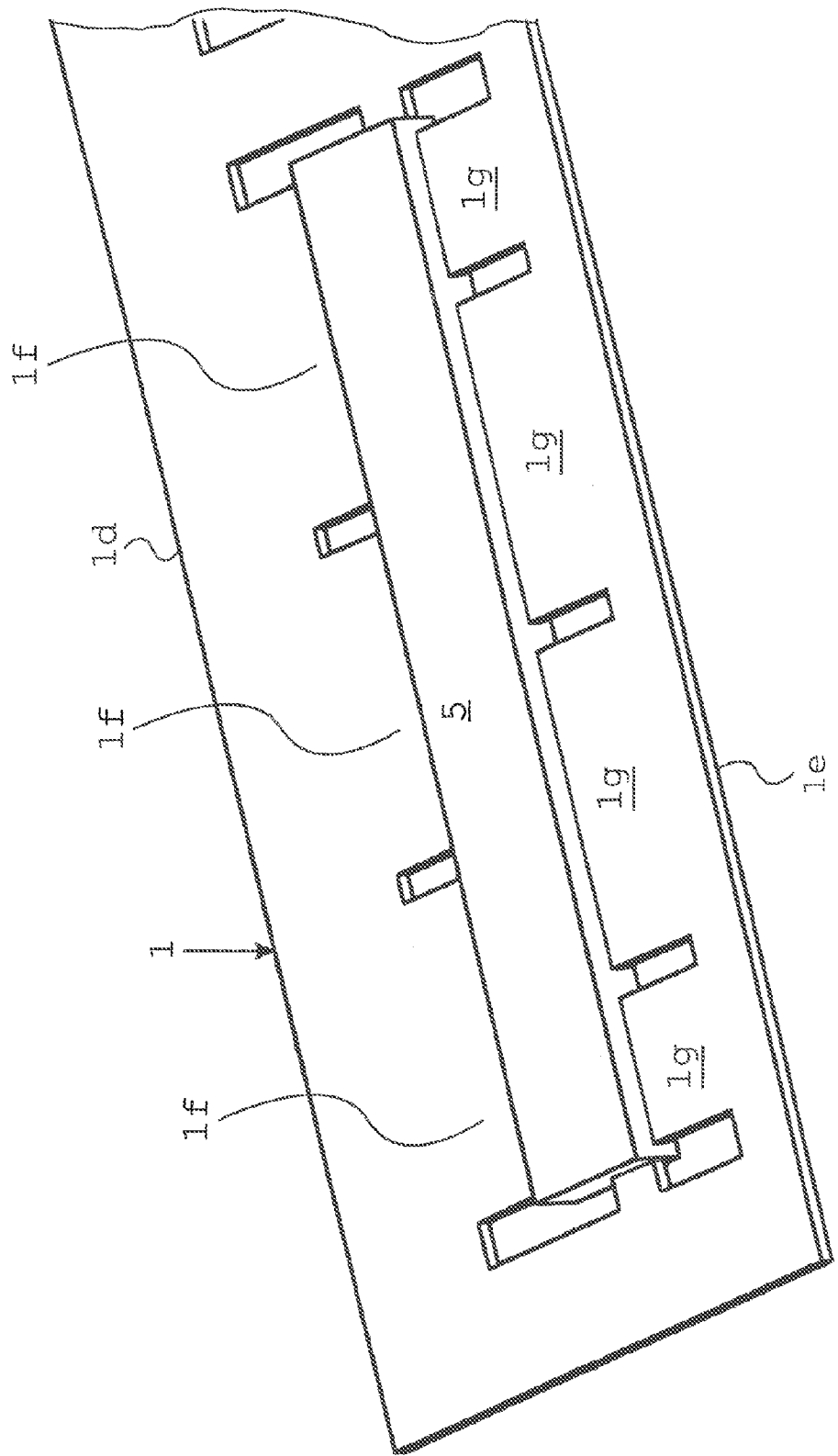
FIG. 3 shows the substrate according to FIG. 2 with an encapsulation.

An encapsulation (5) illustrated in FIG. 3 is then applied to the substrate (1) and bonds integrally to the substrate (1) in the substrate regions (1f and 1g) and completely encases the thermolegs (4a, 4b). The encapsulation (5) extends over the first portion (3a) of the aperture (3) until in the electrically conductive substrate regions (1f, 1g), wherein at least one contact portion (1h) (visible in FIG. 4) of each electrically conductive substrate region (1f, 1g) is not encased however by the encapsulation (5).

In order to avoid a short circuit between the electrically conductive substrate regions (1f, 1g), the encapsulation (5) consists of an electrically non-conductive inorganic or organic material. The encapsulation can be attached by way of injection molding, casting or by spraying. The material provided for the encapsulation (5) is preferably applied to both surfaces (1a) of the substrate, such that the thermolegs (4) are fully encased by both the upper face and the lower face.

Figure 4:
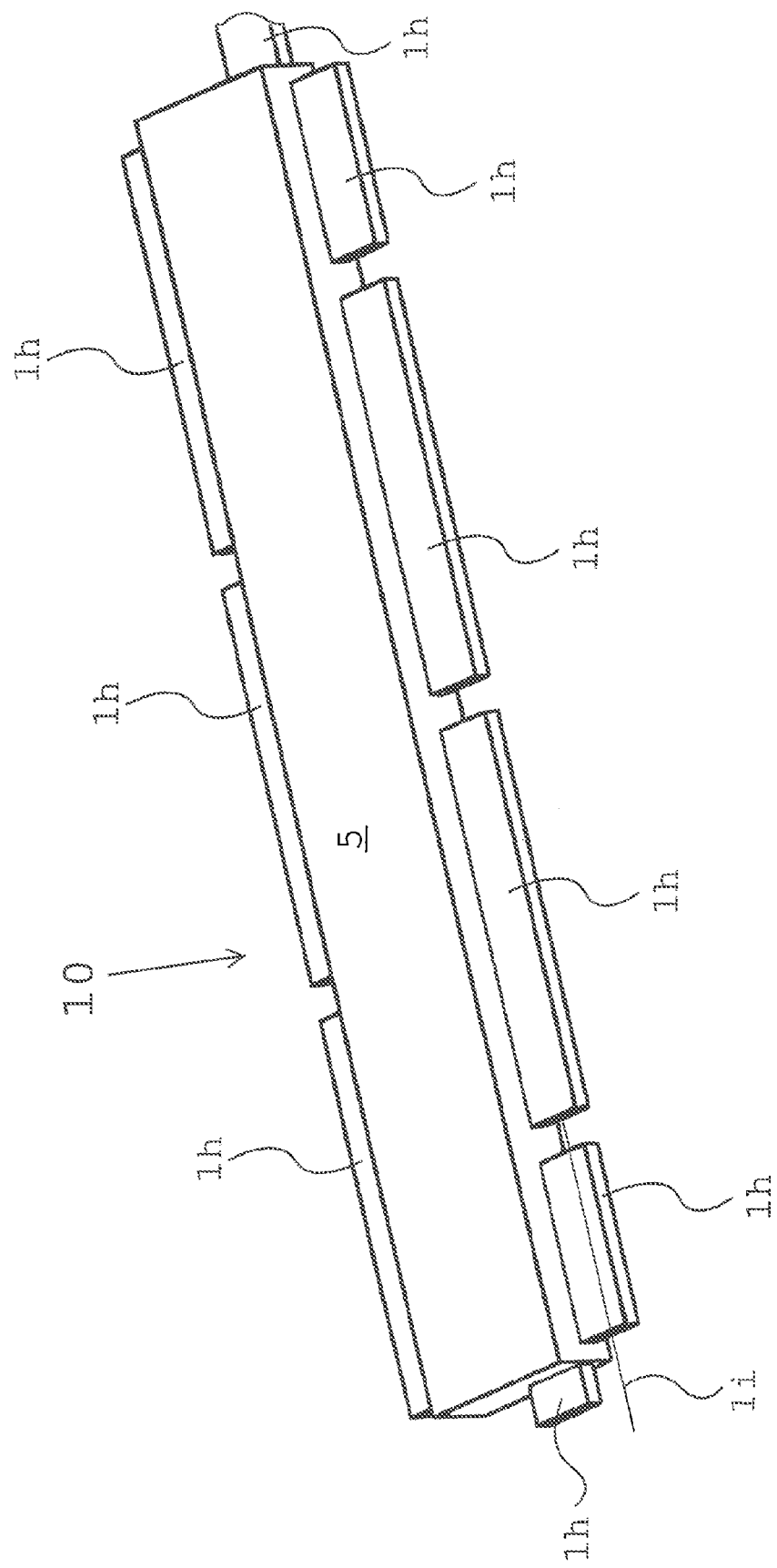
FIG. 4 shows the separation of substrate parts of the substrate according to FIG. 1 and the fabrication of the thermocouple.

In order to prevent a direct flow of electric current between the electrically conductive substrate regions (1f) on the hot side and the substrate regions (1g) on the cold side, the substrate parts serving merely for stabilization are separated from the stabilizing edge of the substrate (1) once the thermolegs have been fitted (FIG. 2) and following encapsulation (FIG. 3). The separation can be implemented by means of a laser or another cutting and punching tool in an automated process. The thermocouple produced after the separation of the stabilizing edge is illustrated in FIG. 4.

Figure 5:
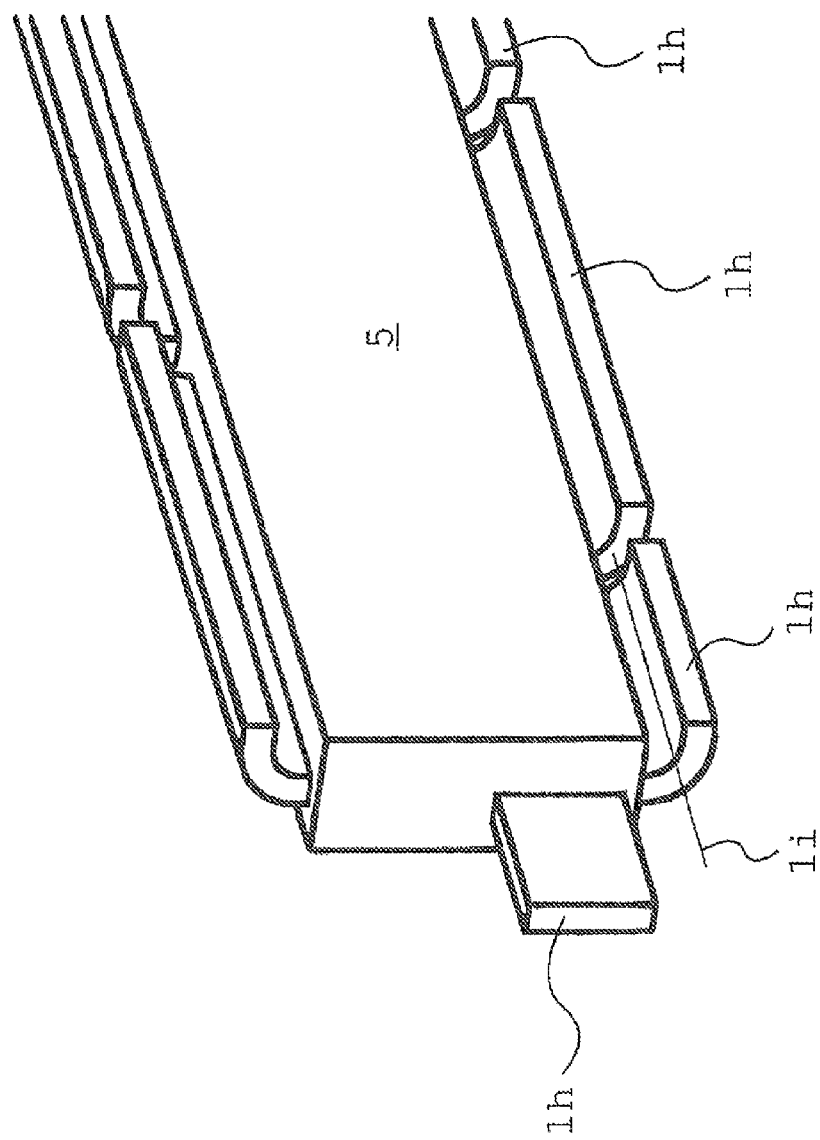
FIG. 5 shows a thermocouple according to FIG. 4 with deflected contact portions.

At the contact portions (1h), the substrate has bending regions for bending each contact portion (1h) about a bending line (1i) parallel to the longitudinal sides (1d, 1e). In particular with relatively low substrate thicknesses, it may be expedient to deflect the contact portions (1h) for example at an angle of 90 degrees, as is illustrated in FIG. 5, in order to create a stable connection to ceramic plates, arranged at a distance, of a module having at least one thermocouple according to FIG. 5. If the stabilizing edge is separated with the aid of a punching tool, the contact portions can be bent through 90 degrees in the same process step.

Figure 6:
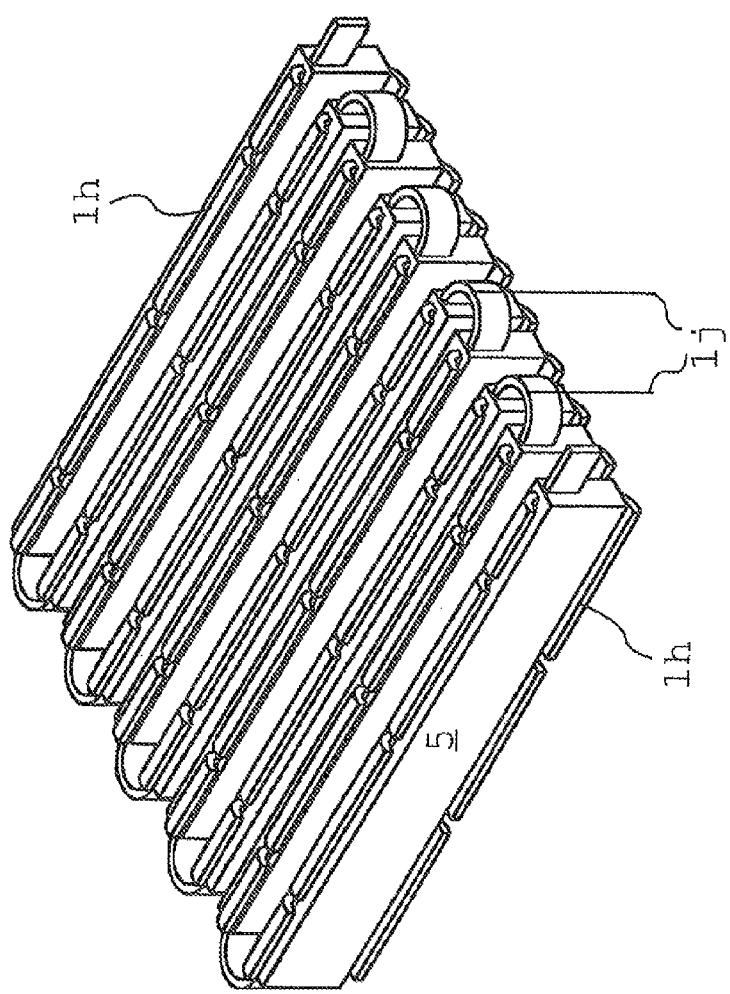
FIG. 6 shows a thermocouple according to FIG. 5 with portions bent alternately through 180 degrees about a bending line parallel to the end sides of the substrate.

An elongate thermocouple can in each case be bent between two thermolegs (4a, 4b) of a plurality of unencapsulated bending regions in order to bend the substrate about a bending line (1j) parallel to the end sides (1b, 1c) alternately through 180 degrees in a clockwise and anticlockwise direction. A "folded three-dimensional structure" as can be seen in FIG. 6 is thus produced.

A thermocouple according to FIG. 5 can be fastened directly on an elongate heat source or heat sink, for example a pipe. If the heat source or heat sink is an object of short longitudinal extension, a folded structure corresponding to FIG. 6 is preferably connected to the object. Possibilities for connection include, for example, soldering, welding or adhesive bonding.

Figure 7:
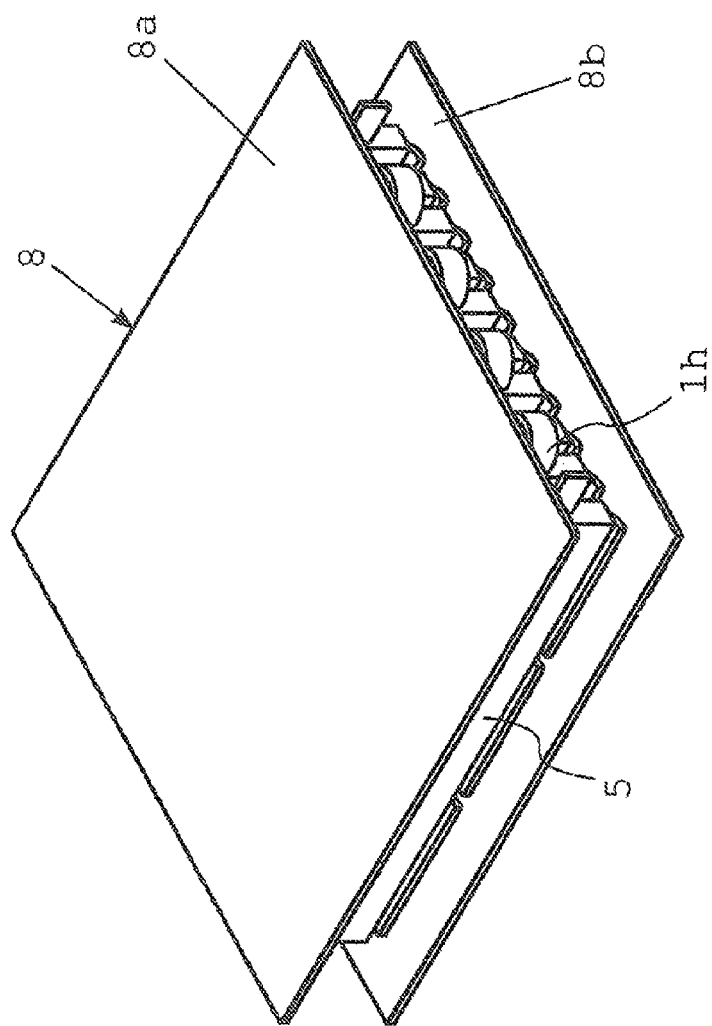
FIG. 7 shows a module with a thermocouple bent a number of times according to FIG. 6.

One or more of the thermocouples corresponding to FIG. 4 or 5 can also be arranged between two ceramic plates. FIG. 7 shows a folded thermocouple corresponding to FIG. 6, which is arranged between two plates (8a, 8b). The connection is made in the same way, specifically by soldering, welding or adhesively bonding the contact portions (1h) to the plates (8a, 8b). It is important that the plates (8a, 8b) forming the module (8) consist of materials having good thermal conductivity, wherein the plates must not produce an electrically conductive connection between the various contact portions (1h). Ceramic materials in particular are considered.

Figure 8:
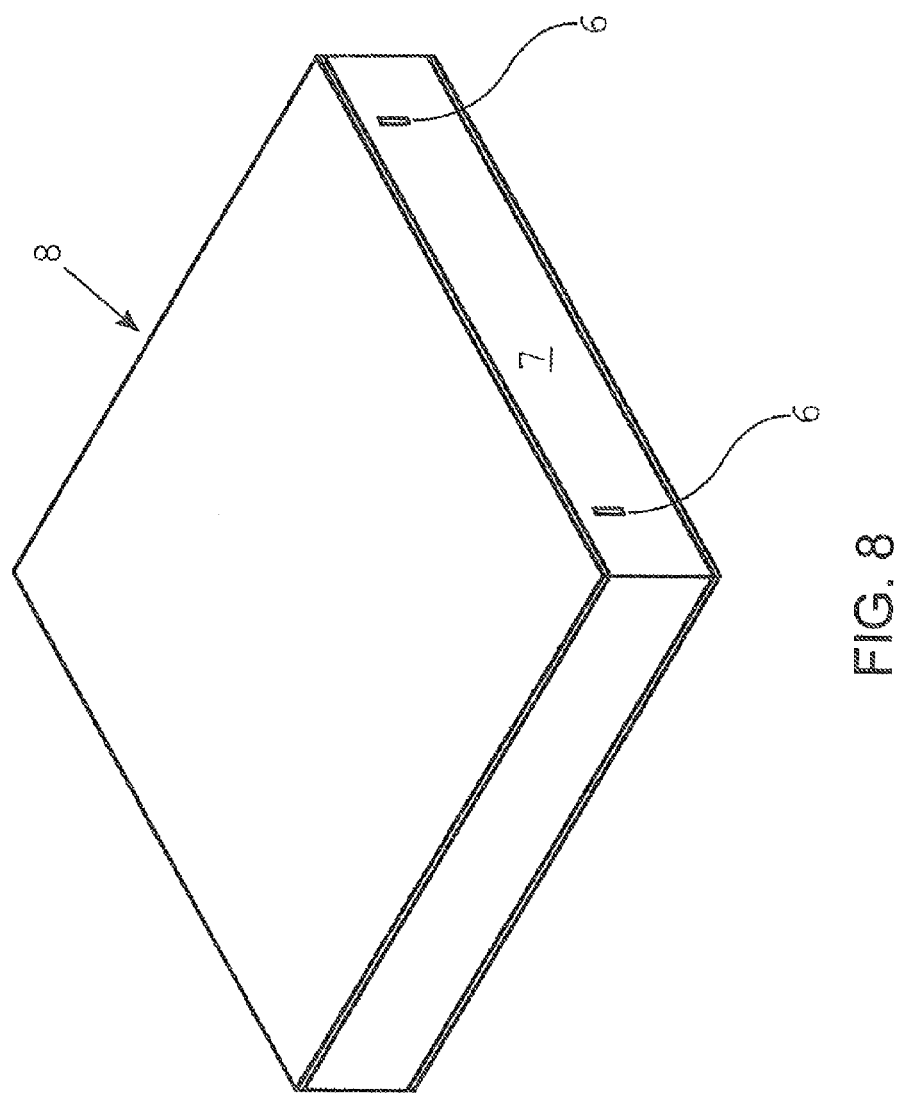
FIG. 8 shows a fully injected module according to FIG. 7.

Lastly, the module according to FIG. 7 can be filled with a filling compound (7) to further increase the mechanical stability. The electric contacts (6) for contacting the thermocouple are led out from the filled module (8) illustrated in FIG. 8.

A thermocouple produced in particular by the method according to the invention comprises thermolegs (4a, 4b), visible in FIG. 2, which are formed of p- and n-doped semiconductor material and are electrically conductively interconnected alternately on a hot side and a cold side, wherein a temperature gradient between the hot and the cold side of the thermocouple can be applied or tapped at the contact portions (1h) visible in FIG. 4.

The thermocouple comprises a plurality of flat supporting parts on the cold and the hot side of the thermocouple (10), said supporting parts being covered in part by the encapsulation (5) illustrated in FIG. 4 and consisting exclusively of the electrically and thermally conductive material of the substrate (1) provided for production and illustrated in FIG. 1. Merely the contact portions (1h) of the supporting parts protrude from the encapsulation (5), whereas the planar faces of each supporting part fitted with thermolegs, all of said faces lying in one plane, are encased by the encapsulation (5).

Each thermoleg (4a, 4b) is placed on a thermoleg face of a supporting part on the hot side and on a thermoleg face of a supporting part on the cold side and is thermally conductively connected to the thermoleg face on the hot side and to the thermoleg face on the cold side. The thermoleg face is formed in particular from the substrate regions (1f, 1g) of the provided substrate (see FIG. 1).

The supporting parts are all arranged at a distance from one another in such a way that they do not contact one another. The distance corresponds in particular to the width of the aperture (3) in substrate according to FIG. 1.

The thermocouple preferably has an encapsulation (5), which can be seen in particular in FIG. 5 and which is integrally bonded on either side to the supporting part on the hot side and to the supporting part on the cold side of each thermoleg and encases each thermoleg. The access to the thermolegs from the lower face via the spacing areas between adjacent supporting parts is thus likewise encapsulated.

The thermolegs (4a, 4b) visible in FIG. 2 have a thickness in the range of 20 μm-500 μm. In this intermediate size range utilized in accordance with the invention, the thermocouple can be formed in one plane, comparatively to thin-film technology. It possible to conduct electric current and heat via the planar electrically and thermally conductive supporting parts into the regions of the flat thermolegs resting thereon.

The supporting parts consist of a plastically deformable material, in particular a metal. This allows the deflection of the supporting parts outside the region fitted with thermolegs, for example in order to form the contact portions visible in FIG. 5.

The invention claimed is:

1. A method for producing a thermocouple having at least two thermolegs, at least one first thermoleg of the at least two thermolegs formed of p-doped semiconductor material and at least one second thermoleg of the at least two thermolegs formed of n-doped semiconductor material are electrically alternatingly conductively interconnected on a hot side and a cold side of the thermocouple, the method comprising the following steps:

providing a substrate consisting of an electrically and thermally conductive material and having at least one aperture dividing the substrate into substrate regions on the hot side and substrate regions on the cold side of the thermocouple;

fitting the substrate with the at least two thermolegs, wherein each of the at least two thermolegs is placed on a substrate region on the hot side and on a substrate region on the cold side and is electrically and thermally conductively connected to the substrate region on the hot side and to the substrate region on the cold side;

applying an encapsulation such that the encapsulation encases each of the at least two thermolegs and the encapsulation bonds integrally to the substrate region on the hot side and to the substrate region on the cold side of the each of the at least two thermolegs; and separating parts of the substrate in such a way that a flow of electric current between the substrate regions on the hot side and the substrate regions on the cold side is prevented by the at least one aperture in the substrate.

2. The method as claimed in claim 1, wherein the each of the at least two thermolegs have a thickness in the range of 20 μm-500 μm.

3. The method as claimed in claim 1, wherein the step of separating is performed after the encapsulation has been attached.

4. The method as claimed in claim 1, further comprising the step of bending unencapsulated substrate regions of the substrate around a bending line after the step of separating.

5. The method as claimed in claim 1, further comprising the step of arranging two plates formed of an insulating material at a distance from one another and parallel to one another, and connecting the substrate on the hot side to one of the two plates and on the cold side to the other of the two plates.

6. A substrate for a thermocouple having at least two thermolegs made in accordance with the method of claim 1, wherein
- the substrate consists of an electrically and thermally conductive material;
- the substrate is cuboidal;
- the substrate has two opposing flat surfaces delimited laterally by end sides and on a hot side and a cold side by longitudinal sides;
- the substrate has at least one aperture through the flat surfaces, the at least one aperture dividing the substrate into substrate regions on the hot side and substrate regions on the cold side;
- the aperture having a first portion parallel to the longitudinal sides, at least one second portion extending from the first portion in the direction toward the longitudinal side on the cold side, and at least one third portion extending from the first portion in the direction toward the longitudinal side on the hot side, the second and third portions being offset in relation to one another in the longitudinal direction.

7. A thermocouple, comprising:
at least two thermolegs, at least one first thermoleg of the at least two thermolegs formed of p-doped semiconductor material and at least one second thermoleg of the at least two thermolegs formed of n-doped semiconductor material are electrically alternatingly conductively interconnected on a hot side and a cold side of the thermocouple, wherein a temperature gradient between the hot and the cold side of the thermocouple can be applied or tapped;

a plurality of supporting parts on the hot side of the thermocouple and a plurality of supporting parts on the cold side of the thermocouple, each of the supporting parts consisting of an electrically and thermally conductive material and having a planar surface fitted with the thermolegs, the planar surfaces of the supporting parts lie in one plane, the supporting parts are arranged at a distance from one another in such a way that they do not contact one another, and each of the at least two thermolegs is electrically and thermally conductively connected to a respective planar surface of a respective one of the supporting parts on the hot side and to the planar surface of a respective one of the supporting parts on the cold side; and at least one encapsulation encasing each thermoleg and bonded to the supporting part on the hot side and to the supporting part on the cold side of each of the at least two thermolegs.

8. The thermocouple as claimed in claim 7, wherein the thermolegs have a thickness in the range of 20 μm-500 μm.

9. The thermocouple as claimed in claim 7, wherein the supporting parts are made of a plastically or elastically deformable material.

10. The thermocouple as claimed in claim 7, wherein a contact portion of the supporting parts is not encased by the encapsulation.

11. The thermocouple as claimed in claim 10, wherein the contact portion is deflected from the plane of the planar surface.

12. A module, comprising:
at least one thermocouple as claimed in claim 7;
two plates arranged at a distance from one another and parallel to one another and made of an insulating material, wherein the thermocouple is connected on the hot side to one of the two plates and is connected on the cold side to the other of the two plates.

* * * * *